United States Patent
Yamamoto

(10) Patent No.: US 11,917,920 B2
(45) Date of Patent: Feb. 27, 2024

(54) PIEZOELECTRIC DEVICE

(71) Applicant: Murata Manufacturing Co., Ltd., Nagaokakyo (JP)

(72) Inventor: Hironari Yamamoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 541 days.

(21) Appl. No.: 17/321,564

(22) Filed: May 17, 2021

(65) Prior Publication Data
US 2021/0273154 A1 Sep. 2, 2021

Related U.S. Application Data

(63) Continuation of application No. PCT/JP2019/039314, filed on Oct. 4, 2019.

(30) Foreign Application Priority Data

Mar. 18, 2019 (JP) ................. 2019-049915

(51) Int. Cl.
*B06B 1/06* (2006.01)
*H10N 30/853* (2023.01)
*H10N 30/87* (2023.01)

(52) U.S. Cl.
CPC ......... *H10N 30/853* (2023.02); *B06B 1/0629* (2013.01); *H10N 30/87* (2023.02)

(58) Field of Classification Search
CPC ..... H10N 30/853; H10N 30/87; B06B 1/0629
(Continued)

(56) References Cited

U.S. PATENT DOCUMENTS

2005/0174015 A1* 8/2005 Scott ................. G06V 40/1306
310/334
2009/0279747 A1 11/2009 Schmitt
(Continued)

FOREIGN PATENT DOCUMENTS

| JP | 2011-524036 A | 8/2011 |
| JP | 2012-521597 A | 9/2012 |
| JP | 2016-513983 A | 5/2016 |

OTHER PUBLICATIONS

Official Communication issued in International Patent Application No. PCT/JP2019/039314, dated Dec. 17, 2019.

*Primary Examiner* — Derek J Rosenau
(74) *Attorney, Agent, or Firm* — Keating & Bennett, LLP

(57) ABSTRACT

A piezoelectric device includes a piezoelectric array, a resin portion, a first electrode, and a second electrode. The piezoelectric array includes piezoelectric pillars having a columnar shape and made of piezoelectric ceramic. The piezoelectric pillars are provided along a row direction and a column direction in a two-dimensional array such that the piezoelectric pillars are parallel or substantially parallel to each other in height direction thereof. The resin portion is located in and preferably fills a gap between the piezoelectric pillars. The first electrode includes first electrode wires extending in the column direction. The second electrode includes second electrode wires extending in the row direction. Both of the piezoelectric pillars and the resin portion resonantly vibrate in a thickness longitudinal vibration mode, and a resonant frequency of the resin portion is higher than a resonant frequency of the piezoelectric pillars by about 15% or greater.

18 Claims, 16 Drawing Sheets

(58) Field of Classification Search
USPC .................................. 310/322, 334, 335
See application file for complete search history.

(56) References Cited

U.S. PATENT DOCUMENTS

| | | |
|---|---|---|
| 2009/0279751 A1 | 11/2009 | Schmitt |
| 2010/0237992 A1 | 9/2010 | Liautaud |
| 2014/0219521 A1 | 8/2014 | Schmitt et al. |
| 2015/0187347 A1* | 7/2015 | Kojima ............ H10N 30/10516 310/322 |
| 2015/0298172 A1* | 10/2015 | Nakamura ............ A61B 8/4488 310/334 |
| 2019/0362118 A1* | 11/2019 | Ahn .................... G06V 40/1306 |

* cited by examiner

MAXIMUM VALUE : 426.187
MINIMUM VALUE : 0.580

PIEZOELECTRIC DEVICE

CROSS REFERENCE TO RELATED APPLICATIONS

This application claims the benefit of priority to Japanese Patent Application No. 2019-049915 filed on Mar. 18, 2019 and is a Continuation Application of PCT Application No. PCT/JP2019/039314 filed on Oct. 4, 2019. The entire contents of each application are hereby incorporated herein by reference.

BACKGROUND OF THE INVENTION

1. Field of the Invention

The present invention relates to a piezoelectric device.

2. Description of the Related Art

U.S. Patent Application Publication No. 2014/0219521, U.S. Patent Application Publication No. 2010/0237992, U.S. Patent Application Publication No. 2009/0279747, and U.S. Patent Application Publication No. 2009/0279751 disclose a piezoelectric device used for detecting biological information, such as a fingerprint.

U.S. Patent Application Publication No. 2014/0219521 discloses a biometric sensing device that includes an array of piezoelectric ceramic elements and a set of electronic devices. In the biometric sensing device described in U.S. Patent Application Publication No. 2014/0219521, the electronic devices and elements are operable in a first mode for obtaining a first set of data for encoding at least one two-dimensional image of a fingerprint of a finger, and also operable in a second mode for obtaining a second set of data for encoding at least one three-dimensional representation of one or more subcutaneous tissue structures located in tissue embedded in the finger. U.S. Patent Application Publication No. 2014/0219521 describes that the above-mentioned elements are composed of a 1 3 composite and FIG. 1B thereof illustrates a 1-3 composite structure in which a filling material fills a gap between columnar elements.

U.S. Patent Application Publication No. 2010/0237992 discloses a sensing device including, as a piezoelectric device, an array of sensing elements. The piezoelectric device is provided for acquiring biometric data or information, such as a fingerprint. In the sensing device described in U.S. Patent Application Publication No. 2010/0237992, the sensing elements operate based on the acoustic impediography principle. FIGS. 6 and 7A of U.S. Patent Application Publication No. 2010/0237992 illustrate a 1-3 composite structure in which a filling material fills a gap between columnar piezoelectric ceramic elements as is the case with U.S. Patent Application Publication No. 2014/0219521. U.S. Patent Application Publication No. 2010/0237992 describes imaging a fingerprint by utilizing a difference between a load given to the elements by a fingerprint swell (ridge) and a load given to the elements by a fingerprint cavity (valley).

U.S. Patent Application Publication No. 2009/0279747 and U.S. Patent Application Publication No. 2009/0279751 also disclose a sensing device based on the acoustic impediography principle and describe a 1-3 composite structure in which piezoelectric pillars are embedded in a matrix material such as polymer. U.S. Patent Application Publication No. 2009/0279747 and U.S. Patent Application Publication No. 2009/0279751 describe that shear waves are generated when the pillars vibrate in a longitudinal mode and the shear waves cause substantial loss of energy and damp the vibration of the pillars. In U.S. Patent Application Publication No. 2009/0279747 and U.S. Patent Application Publication No. 2009/0279751, as a result of considering the shear wave generation and propagation within the matrix material, the pillars are arranged such that a neighbor pillar reflects shear waves back to a pillar from which the shear waves are generated. More specifically, an effect of reflecting a shear wave is optimized if the distance between pillars is a quarter wavelength of the shear wave.

U.S. Patent Application Publication No. 2014/0219521 and U.S. Patent Application Publication No. 2010/0237992 describe the 1-3 composite structure, but there is no description or indication as to a specific structure with which characteristics are improved. Further, although U.S. Patent Application Publication No. 2009/0279747 and U.S. Patent Application Publication No. 2009/0279751 focus on the relationship between a wavelength of a shear wave, which propagates within the matrix material, and a distance between pillars, it is hard to say that this is practical.

The inventor of preferred embodiments of the present invention has considered an influence of a 1-3 composite structure on characteristics and discovered that the characteristics are affected also by a resonant frequency in a thickness longitudinal direction of a resin portion which fills a gap between piezoelectric pillars. However, the related art has not taken into account a resonant frequency in the thickness longitudinal direction of a resin portion in designing, and thus, there has been a problem that vibration of piezoelectric pillars is inhibited by vibration of the resin portion. Further, the related art has not shown design guidelines to avoid the above-described problems.

SUMMARY OF THE INVENTION

Preferred embodiments of the present invention provide piezoelectric devices that are each able to reduce or prevent deterioration in vibration characteristics of piezoelectric pillars caused by vibration of a resin portion.

A piezoelectric device according to a preferred embodiment of the present invention includes a piezoelectric array which includes a plurality of piezoelectric pillars, the piezoelectric pillars having a columnar shape and being made of piezoelectric ceramic, and in which the plurality of piezoelectric pillars are provided along a row direction and a column direction in a two-dimensional array, such that the piezoelectric pillars are parallel or substantially parallel to each other in a height direction thereof; a resin portion located in a gap between the plurality of piezoelectric pillars; a first electrode including a plurality of first electrode wires extending in the column direction, the plurality of first electrode wires being provided along the column direction of the piezoelectric array and being connected to first end portions of the piezoelectric pillars; and a second electrode including a plurality of second electrode wires extending in the row direction, the plurality of second electrode wires being provided along the row direction of the piezoelectric array and being connected to second end portions of the piezoelectric pillars. Both of the piezoelectric pillars and the resin portion resonantly vibrate in a thickness longitudinal vibration mode. A resonant frequency of the resin portion is higher than a resonant frequency of the piezoelectric pillars by about 15% or greater.

According to preferred embodiments of the present invention, piezoelectric devices are provided that are each able to reduce or prevent deterioration in vibration characteristics of piezoelectric pillars caused by vibration of a resin portion.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Piezoelectric devices according to preferred embodiments of the present invention will be described below with reference to the drawings.

However, the present invention is not limited to the preferred embodiments described below and may be applied with appropriate alterations or modifications. In addition, preferred embodiments of the present invention also include combinations of two or more features and/or elements of different preferred embodiments of the present invention described below.

Figure 1:
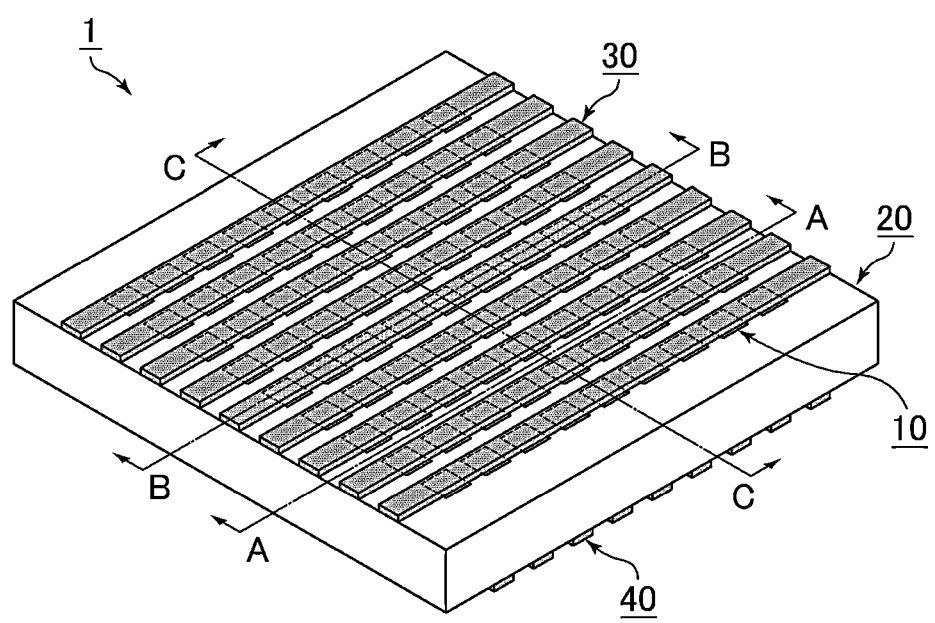
FIG. 1 is a perspective view schematically illustrating an example of a piezoelectric device according to a preferred embodiment of the present invention.
Figure 2:
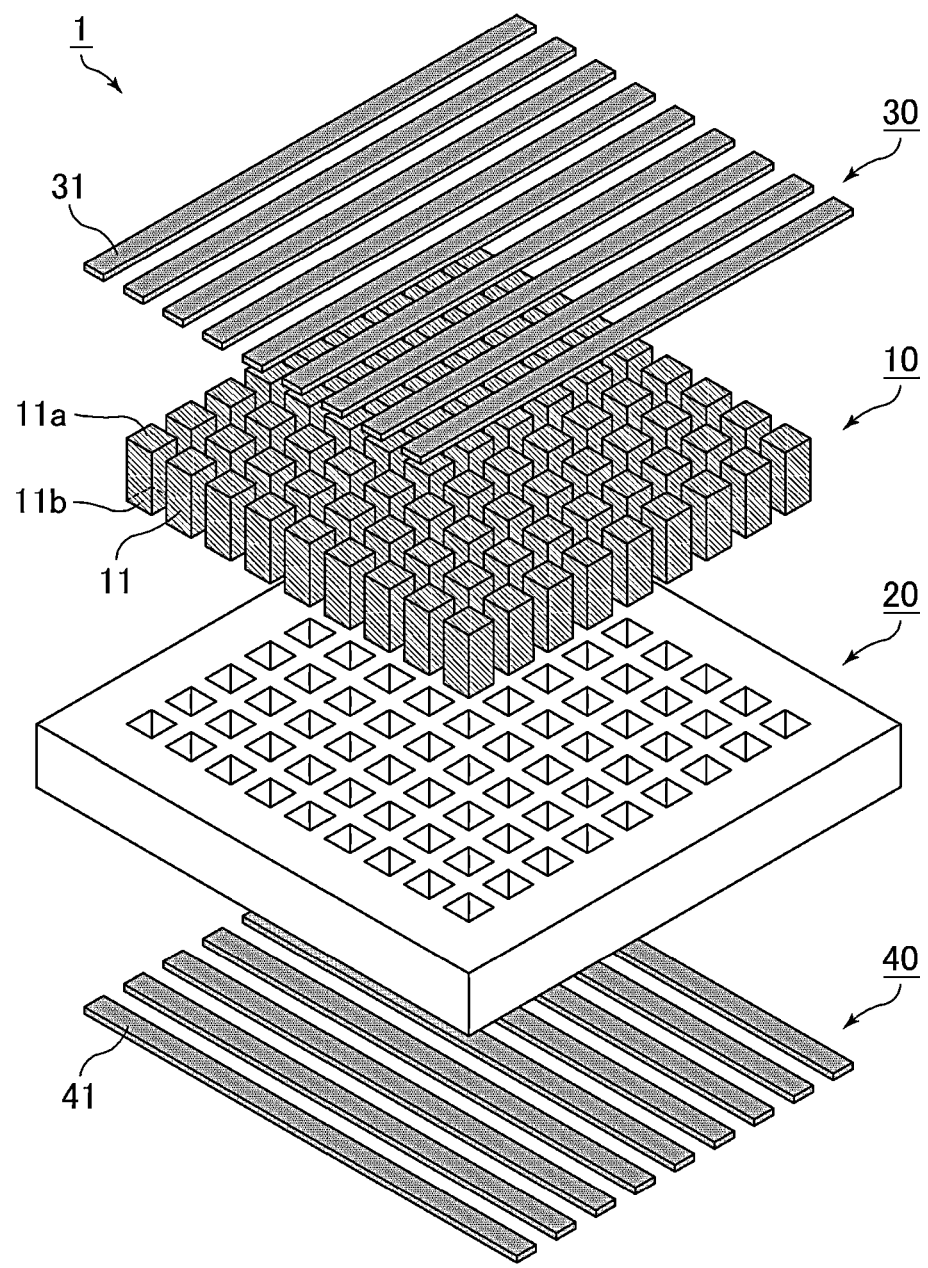
FIG. 2 is an exploded perspective view of the piezoelectric device illustrated in FIG. 1.

FIG. 1 is a perspective view schematically illustrating an example of a piezoelectric device according to a preferred embodiment of the present invention. FIG. 2 is an exploded perspective view of the piezoelectric device illustrated in FIG. 1.

The piezoelectric device 1 illustrated in FIG. 1 includes a piezoelectric array 10, a resin portion 20, a first electrode 30, and a second electrode 40 as illustrated in FIG. 2.

The piezoelectric array 10 includes a plurality of columnar piezoelectric pillars 11 as illustrated in FIG. 2. The plurality of piezoelectric pillars 11 are provided along a row direction and a column direction in a two-dimensional array so that the piezoelectric pillars 11 are parallel or substantially parallel to each other in their height direction (thickness direction). When a direction orthogonal or substantially orthogonal to the row direction and column direction of the piezoelectric array 10 is set to the thickness direction of the piezoelectric array 10, the thickness direction of the piezoelectric array 10 is parallel or substantially parallel to the height direction of the piezoelectric pillars 11. Further, the row direction and column direction of the piezoelectric array 10 are preferably orthogonal or substantially orthogonal to each other.

A poling treatment is applied to the piezoelectric pillars 11 in the height direction. The polarization direction may be the upward direction or the downward direction as long as the direction is the height direction. However, the polarization direction needs to be the same in all the piezoelectric pillars 11.

The piezoelectric pillars 11 are made of piezoelectric ceramic, for example. The piezoelectric ceramic preferably has a higher piezoelectric constant d33 in the vertical direction and, for example, a soft material is used for it.

A pitch of the piezoelectric array 10 is preferably set, for example, referring to the resolution of 500 dpi for a fingerprint used by the Federal Bureau of Investigation (FBI), and the piezoelectric pillars 11 are provided with a pitch of about 50.8 μm, for example. The pitch of the piezoelectric pillars 11 is preferably the same or substantially the same in the row direction and the column direction.

The piezoelectric array 10 includes 120 rows×120 columns=14,400 piezoelectric pillars 11, for example, secure a sufficient area to detect biological information, such as a fingerprint.

The shape of the piezoelectric pillar 11 is preferably a quadrangular prism, but may be a circular cylinder, for example. When the shape of the piezoelectric pillar 11 is a quadrangular prism, a planar shape of the piezoelectric pillar 11 viewed in the thickness direction of the piezoelectric array 10 is preferably a square, for example.

The height (thickness) of the piezoelectric pillar 11 is related to a resonant frequency of thickness longitudinal vibration which will be described later. A frequency of ultrasonic echo used in medicine is typically from about 2.5 MHz to about 3.5 MHz inclusive. However, a resolution in a further planar direction is required so as to detect biological information, such as, for example, a fingerprint and a minute blood vessel. A frequency of approximately 20 MHz is appropriate in this case, so the height of the piezoelectric pillar 11 is preferably set to, for example, about 70 μm in order to adjust a resonant frequency of the thickness longitudinal vibration to approximately 20 MHz.

The resin portion 20 is located in and preferably fills a gap between the plurality of piezoelectric pillars 11 of the piezoelectric array 10. In other words, the plurality of piezoelectric pillars 11 are embedded in the resin portion 20. The piezoelectric array 10 and the resin portion 20 define a 1-3 composite.

The resin portion 20 maintains the arrangement of the piezoelectric pillars 11 while allowing the piezoelectric pillars 11 to independently vibrate.

In FIGS. 1 and 2, the thickness of the resin portion 20 is the same or substantially the same as the height of the piezoelectric pillars 11. However, to set resonance in the thickness direction of the resin portion 20 to a higher frequency, the thickness of the resin portion 20 is preferably smaller than the height of the piezoelectric pillars 11.

The first electrode 30 is a drive electrode (Tx electrode). The first electrode 30 includes a plurality of first electrode wires 31 which extend in the column direction, as illustrated in FIG. 2. The plurality of first electrode wires 31 are provided along the column direction of the piezoelectric array 10 and are connected to first end portions 11a of the piezoelectric pillars 11. In FIGS. 1 and 2, the first electrode wire 31 is connected to the upper ends of the piezoelectric pillars 11 so that the first electrode wire 31 is connected to all of the piezoelectric pillars 11 on the same straight line in the column direction of the piezoelectric array 10. For example, when the piezoelectric array 10 includes 120 rows×120 columns=14,400 piezoelectric pillars 11, the first electrode 30 includes 120 columns of first electrode wires 31 and covers the upper ends of all the piezoelectric pillars 11.

The second electrode 40 is a reception electrode (Rx electrode). The second electrode 40 includes a plurality of second electrode wires 41 which extend in the row direction, as illustrated in FIG. 2. The plurality of second electrode wires 41 are provided along the row direction of the piezoelectric array 10 and are connected to second end portions 11b of the piezoelectric pillars 11. In FIGS. 1 and 2, the second electrode wire 41 is connected to the lower ends of the piezoelectric pillars 11 so that the second electrode wire 41 is connected to all of the piezoelectric pillars 11 on the same straight line in the row direction of the piezoelectric array 10. For example, when the piezoelectric array 10 includes 120 rows×120 columns=14,400 piezoelectric pillars 11, the second electrode 40 includes 120 rows of second electrode wires 41 and covers the lower ends of all the piezoelectric pillars 11.

A driving method in outputting ultrasonic waves and a receiving method for ultrasonic waves will now be described. For example, a case will be described in which piezoelectric pillars 11 on the center or approximate center of the piezoelectric array 10, defining the piezoelectric device 1 illustrated in FIG. 1, are driven. In this case, the piezoelectric pillars 11 on the center or approximate center vibrate if a voltage (about 20 MHz, about 10 Vpp, for example) to drive is applied to first electrode wires 31 on the center or approximate center of the first electrode 30 and second electrode wires 41 on the center or approximate center of the second electrode 40 is connected to a ground (GND). Other electrode wires are floating electrodes. On the other hand, for the case of receiving ultrasonic waves by the piezoelectric pillars 11 on the center or approximate center, ultrasonic waves can be detected if the first electrode wires 31 on the center or approximate center of the first electrode 30 are connected to the GND and a voltage of the second electrode wires 41 on the center or approximate center of the second electrode 40 is drawn.

In the piezoelectric device 1 illustrated in FIG. 1, both of the piezoelectric pillars 11 and the resin portion 20 resonantly vibrate in a thickness longitudinal vibration mode.

Figure 3A:
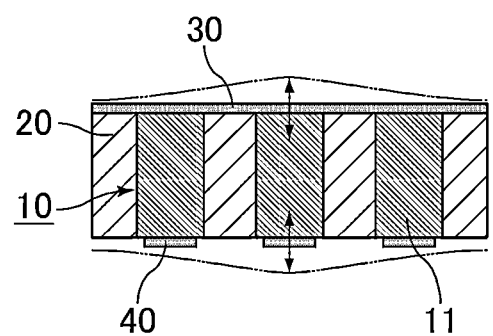
FIG. 3A is an explanatory diagram for a thickness longitudinal vibration mode of piezoelectric pillars.

FIG. 3A is an explanatory diagram for a thickness longitudinal vibration mode of piezoelectric pillars.

As illustrated in FIG. 3A, the thickness longitudinal vibration mode of the piezoelectric pillars 11 is a mode in which the piezoelectric pillars 11 vibrate in the thickness direction of the 1-3 composite, namely, in the thickness direction of the piezoelectric array 10 and the resin portion 20. In other words, the thickness longitudinal vibration mode is a mode in which the piezoelectric pillars 11 vibrate in a reverse phase between the upper ends and the lower ends of the piezoelectric pillar 11 (when the upper ends are displaced upward, the lower ends are displaced downward).

Figure 3B:
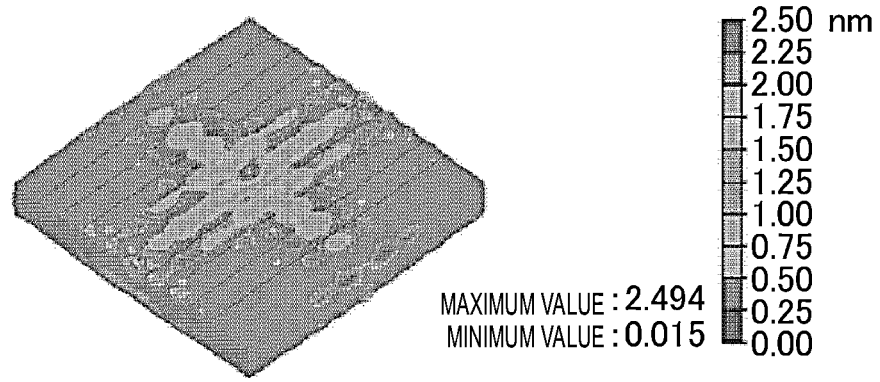
FIG. 3B is a displacement diagram of piezoelectric pillars in resonance.

FIG. 3B is a displacement diagram of piezoelectric pillars during resonance.

The contour diagram illustrated in FIG. 3B is a displacement diagram obtained by analyzing the model illustrated in FIGS. 1 and 2 by the finite element method (FEM). In FIG. 3B, the piezoelectric pillars on the center or approximate center are vibrated at a resonance point in thickness longitudinal vibration of the piezoelectric pillars and amounts of displacement are separately colored depending on the magnitude of the amounts of displacement. As illustrated in FIG. 3B, even when only the piezoelectric pillars on the center or approximate center are vibrated, surrounding piezoelectric pillars are also affected and vibrated because the resonant frequency of the surrounding piezoelectric pillars is the same or substantially the same as the frequency of the piezoelectric pillars on the center or approximate center. Here, thickness affects thickness longitudinal vibration. When the thickness is increased, a wavelength is elongated and a resonant frequency in the thickness longitudinal vibration is accordingly lowered.

Figure 4A:
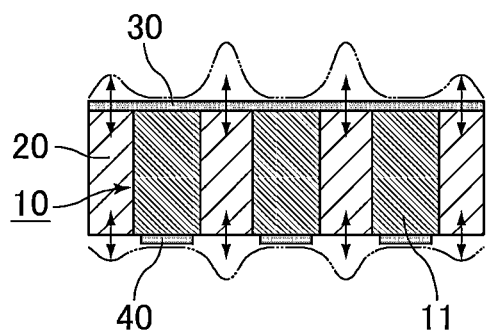
FIG. 4A is an explanatory diagram for a thickness longitudinal vibration mode of a resin portion.
Figure 4B:
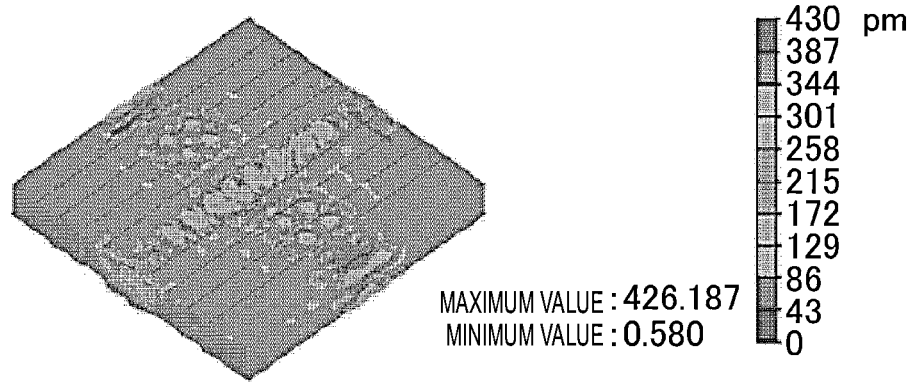
FIG. 4B is a displacement diagram of the resin portion in resonance.

In a similar manner, FIG. 4A is an explanatory diagram for a thickness longitudinal vibration mode of a resin portion. FIG. 4B) is a displacement diagram of the resin portion in resonance.

The thickness of the resin portion 20 is the same or substantially the same as the height of the piezoelectric pillars 11, so the resonant frequency in thickness longitudinal vibration of the resin portion 20 is mostly approximate to resonance of the piezoelectric pillars 11. Further, thickness longitudinal vibration is affected by an acoustic velocity (Young's modulus, density) and a size of a vibration area, as well as thickness. The size of the piezoelectric pillars 11 is typically larger than the size of the resin portion 20, so the resonant frequency of the resin portion 20 is higher than the resonant frequency of the piezoelectric pillars 11.

However, if the resonant frequency of the resin portion is closer to the resonant frequency of the piezoelectric pillars, vibration of the piezoelectric pillars is inhibited.

Figure 5A:
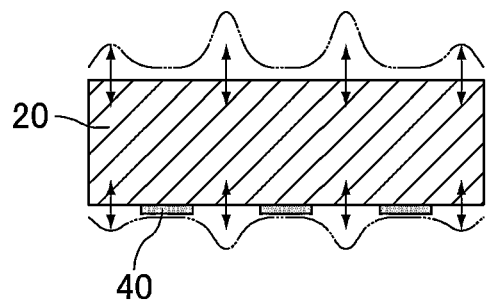
FIGS. 5A to 5D are sectional views of the piezoelectric device illustrated in FIG. 1.
Figure 5B:
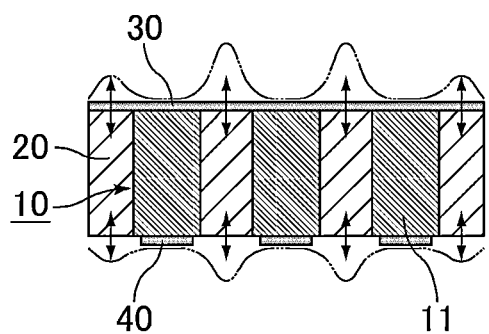
Figure 5C:
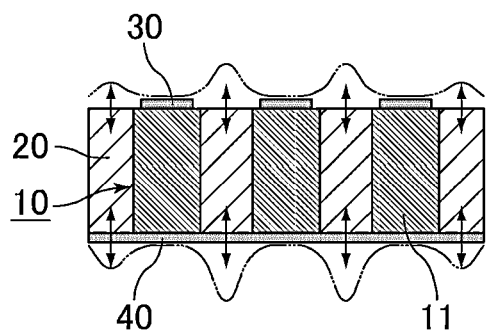

FIGS. 5A to 5D are sectional views of the piezoelectric device illustrated in FIG. 1. FIG. 5A is an A-A line sectional view, FIG. 5B is a B-B line sectional view, and FIG. 5C is a C-C line sectional view.

Figure 5D:
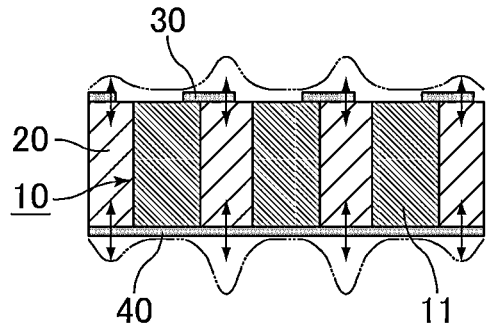

As illustrated in FIG. 5A, the entire thickness is smaller on a portion with no first electrode 30 in a region of the resin portion 20, so resonance occurs at a higher frequency. On the other hand, the frequency is lower on a portion with the first electrode 30 as illustrated in FIGS. 5B and 5C, so the resonant frequency of the resin portion 20 is closer to the resonant frequency of the piezoelectric pillars 11. When the pattern of the first electrode 30 is shifted as illustrated in FIG. 5D, the resin portion 20 is sandwiched by the first electrode 30 and the second electrode 40. Accordingly, the resonant frequency of the resin portion 20 is closer to the resonant frequency of the piezoelectric pillars 11, which causes deterioration in characteristics.

With the piezoelectric device according to the present preferred embodiment, the resonant frequency of the resin portion is higher than the resonant frequency of the piezoelectric pillars by about 15% or greater, for example. This can reduce or prevent deterioration in vibration characteristics of the piezoelectric pillars caused by vibration of the resin portion.

If a resonant frequency of piezoelectric pillars is close to a resonant frequency of a resin portion during driving of the piezoelectric pillars at the resonant frequency of the piezoelectric pillars, vibration of the piezoelectric pillars and vibration of the resin portion cancel each other out because a phase in the vibration of the piezoelectric pillars and a phase in the vibration of the resin portion are different from each other. Further, the piezoelectric pillars are driven at the resonant frequency close to the resonant frequency of the resin portion, so an amplitude of the resin portion is raised and forces cancelling the vibration are accordingly increased.

Figure 6:
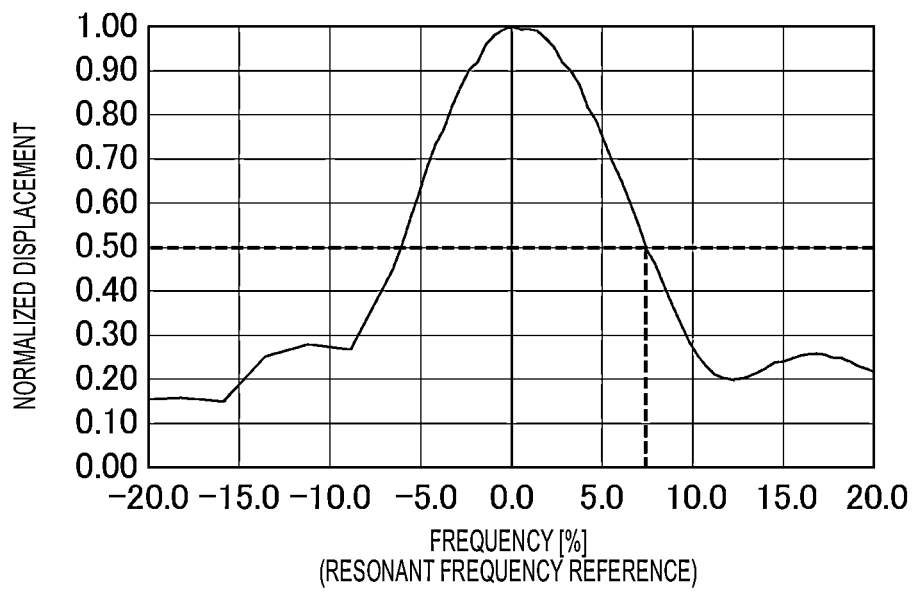
FIG. 6 is a graph showing frequency dependence of displacement of piezoelectric pillars.

FIG. 6 is a graph showing frequency dependence of displacement of piezoelectric pillars.

FIG. 6 shows displacement obtained when piezoelectric pillars are driven at around a resonant frequency. There is a frequency at which half displacement of the peak is obtained on about 7.5% on the higher-frequency side from the resonant frequency. Obviously, it is considered that resonance of the resin portion which is closer than about 7.5% largely affects vibration of the piezoelectric pillars. On the other hand, when the resonance of the resin portion is about 15% or farther, vibration itself of the piezoelectric pillars becomes about ¼ or smaller. Accordingly, an influence on the vibration of the piezoelectric pillars can be predicted to be smaller.

Figure 7:
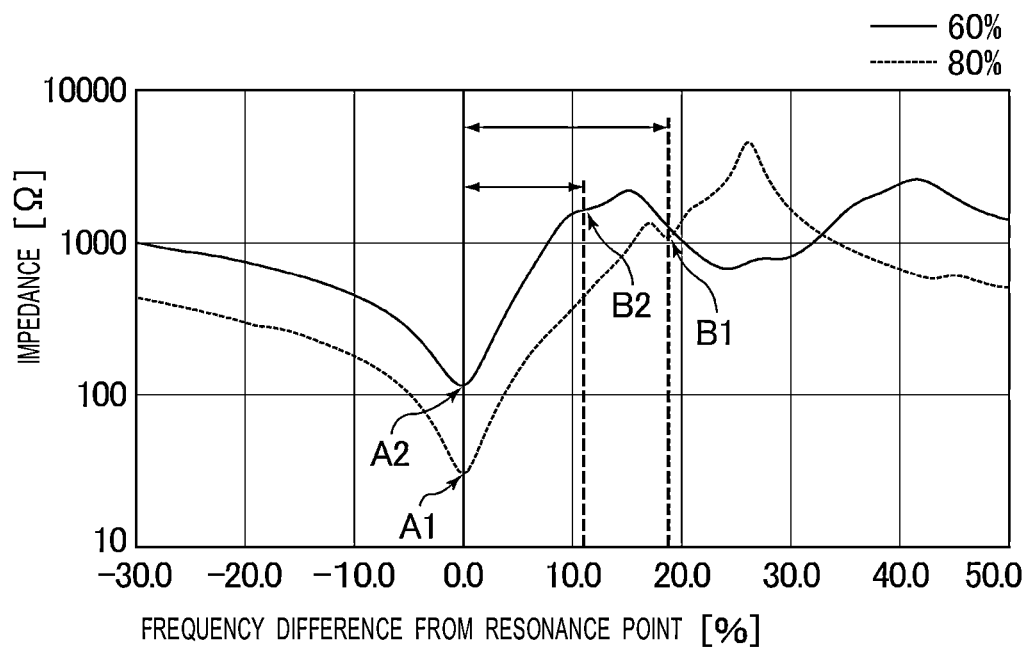
FIG. 7 is a graph showing an influence by a difference between a resonant frequency of piezoelectric pillars and a resonant frequency of a resin portion.

FIG. 7 is a graph showing an influence by a difference between a resonant frequency of piezoelectric pillars and a resonant frequency of a resin portion. FIG. 7 shows experimental values of impedance waveforms of piezoelectric pillars. A size of one piezoelectric pillar is about 60% or about 80% with respect to a pitch of a piezoelectric array and the piezoelectric pillar has a square planar shape when viewed in the thickness direction of the piezoelectric array. The size of one piezoelectric pillar means an average from an upper end to a lower end of the piezoelectric pillar.

In the impedance waveforms shown in FIG. 7, a frequency at the lowest impedance (a point denoted by A1 or A2 in FIG. 7) is a resonance point and the impedance on the point is referred to as resonant resistance. In general, a vibrator having smaller resonant resistance is considered to be a better vibrator. The impedance waveforms shown in FIG. 7 have a concaved point in the middle or approximate middle (a point denoted by B1 or B2 in FIG. 7). This represents an influence by resonance of the resin portion and this point can be considered as a resonant frequency of the resin portion. The resonant frequency of the resin portion is near about 11% of frequency denoted by the point B2 when the size of one piezoelectric pillar is about 60% and the resonant frequency of the resin portion is near about 19% of frequency denoted by the point B1 when the size of one piezoelectric pillar is about 80%. The resonant resistance is about 116 Ω denoted by the point A2 when the size of one piezoelectric pillar is about 60%. On the other hand, the resonant resistance is about 31 Ω denoted by the point A1 when the size of one piezoelectric pillar is about 80%, thus being lower to be approximately ¼.

Figure 8:
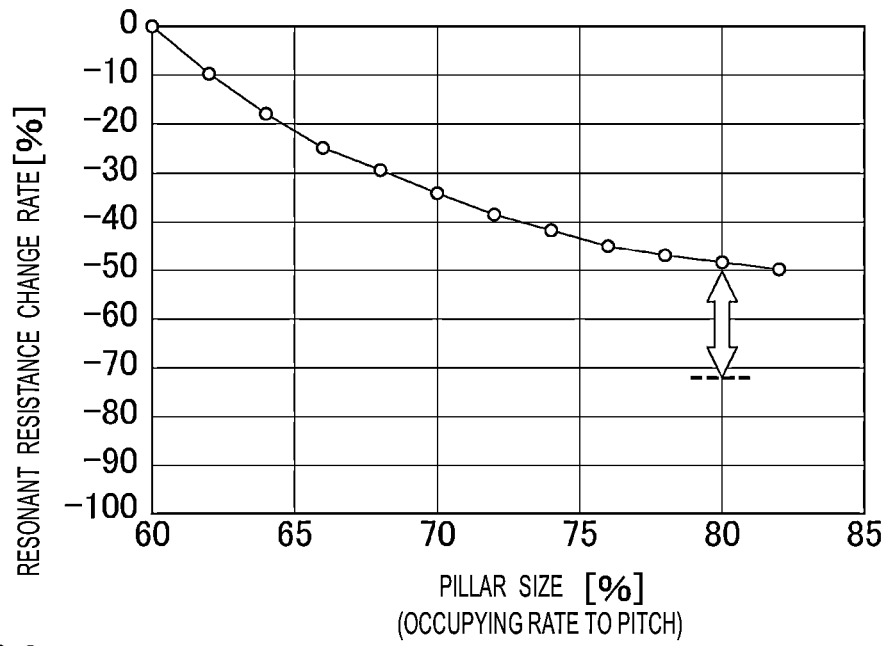
FIG. 8 is a graph showing a relationship between a change rate of resonant resistance and a size of one piezoelectric pillar.

FIG. 8 is a graph showing a relationship between a change rate of resonant resistance and a size of one piezoelectric pillar. FIG. 8 shows calculation values based on FEM.

When the size of one piezoelectric pillar is changed from about 60% to about 80%, the size of one piezoelectric pillar is increased to be about double in its area. Therefore, the resonant resistance is considered to be about half in principle as illustrated in FIG. 8. While on the other hand, the resonant resistance is lowered to be approximately ¼ as illustrated in FIG. 7. This is considered to be nothing other than because the influence of vibration of the resin portion is reduced.

It is preferable that the resonant frequency of the resin portion is about 200% or lower with respect to the resonant frequency of the piezoelectric pillars in a piezoelectric device according to a preferred embodiment of the present invention. The resonant frequency of the resin portion exceeding about 200% of the resonant frequency of the piezoelectric pillars means that Young's modulus of the resin portion is increased or a region of the resin portion is small, meaning that resin between the piezoelectric pillars is substantially hard. In other words, independence among the piezoelectric pillars is deteriorated, which degrades resolution. Further, hard resin between the piezoelectric pillars inhibits vibration of the piezoelectric pillars and accordingly causes amplitude reduction.

The piezoelectric device according to the present preferred embodiment is applicable to, for example, detecting biological information, such as a fingerprint and a minute blood vessel, for example. Accordingly, the piezoelectric device can be used for biometric authentication, such as a fingerprint sensor.

Figure 9:
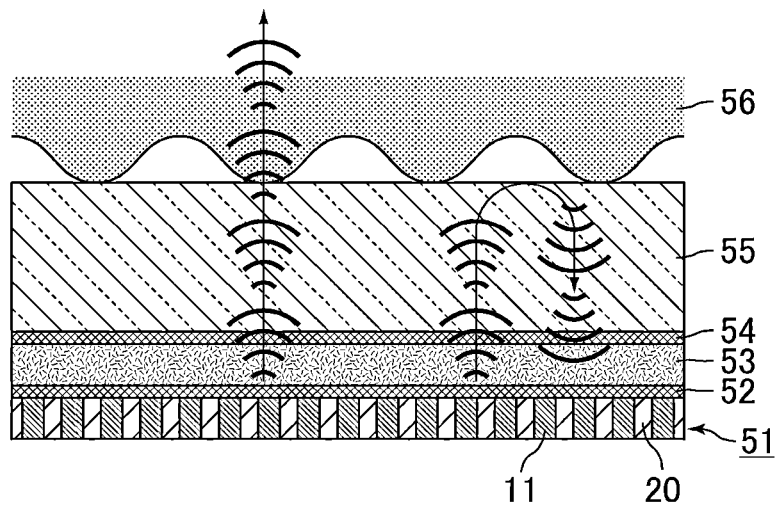
FIG. 9 is an explanatory diagram schematically illustrating a principle to detect a fingerprint with ultrasonic waves.

FIG. 9 is an explanatory diagram schematically illustrating a principle to detect a fingerprint with ultrasonic waves.

In FIG. 9, a fingerprint sensor 51, a first functional film 52, an organic EL (OLED) display 53, a second functional film 54, a cover glass 55, and a fingerprint 56 are stacked in this order from the bottom. The fingerprint 56 include ridge portions and valley portions. The ridges of the fingerprint 56 are in contact with the surface of the cover glass 55 and the valleys of the fingerprint 56 are not in contact with the surface of the cover glass 55. As the fingerprint sensor 51, the piezoelectric device 1 illustrated in FIGS. 1 and 2 are used, for example. Ultrasonic waves can be generated to a direction in which the fingerprint 56 is present by vibrating piezoelectric pillars 11 of the fingerprint sensor 51. When a ridge of the fingerprint 56 is directly above the piezoelectric pillar 11 which generates ultrasonic waves, the ultrasonic waves penetrate into the finger and are rarely reflected. On the other hand, when a valley of the fingerprint 56 is directly above the piezoelectric pillar 11 which generates ultrasonic waves, there is an air layer between the cover glass 55 and the fingerprint 56. An acoustic impedance of glass and an acoustic impedance of air are very different from each other (glass: about $13.2 \times 10^6$ kg/m$^2$·s, air: about 428 kg/m$^2$·s). Accordingly, all or substantially all of the ultrasonic waves are reflected and return to the piezoelectric pillar 11. The piezoelectric pillar 11 vibrates in response to the returned ultrasonic waves and outputs an electric signal. Thus, a fingerprint can be detected.

EXAMPLES

Examples of preferred embodiments of the present invention will be described below. Note that preferred embodiments of the present invention is not limited only to these examples. Further, components described in different examples may be partially replaced or combined with each other.

EXAMPLE 1

In a piezoelectric device of Example 1 of a preferred embodiment of the present invention, a resonant frequency of a resin portion is higher than a resonant frequency of piezoelectric pillars by about 15% or greater, and an area of one piezoelectric pillar is about 49% or greater with respect to an area of one dot of the piezoelectric array in plan view in the thickness direction of the piezoelectric array.

For example, when the planar shape of the piezoelectric pillar viewed in the thickness direction of the piezoelectric array is square or circular, the resonant frequency of the resin portion is higher than the resonant frequency of the piezoelectric pillar by about 15% or greater and the size of one piezoelectric pillar is about 70% or greater with respect to a pitch of the piezoelectric array in plan view in the thickness direction.

Figure 10:
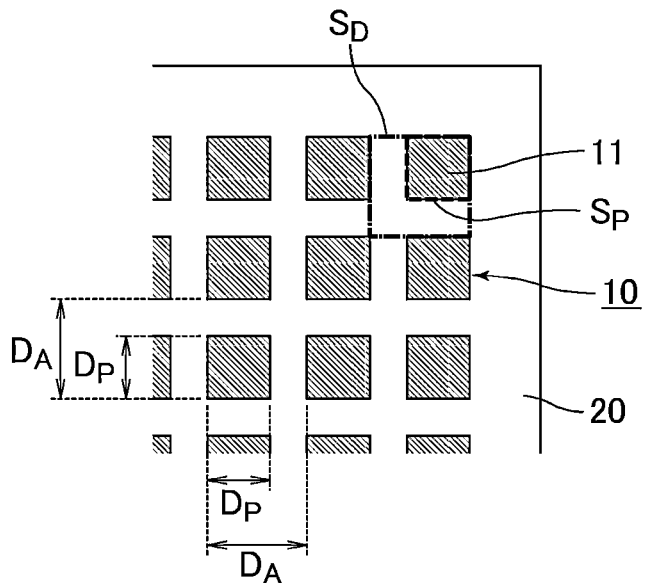
FIG. 10 is a plan view schematically illustrating an example of a piezoelectric device according to Example 1 of a preferred embodiment of the present invention.

FIG. 10 is a plan view schematically illustrating an example of a piezoelectric device according to Example 1.

In FIG. 10, the size of the piezoelectric pillar 11 is denoted by $D_P$, the pitch of the piezoelectric array 10 is denoted by $D_A$, the area of the piezoelectric pillar 11 is denoted by $S_P$, and the area of one dot of the piezoelectric array 10 is denoted by $S_D$.

The size and area of the piezoelectric pillar 11 mean an average from the upper end to the lower end of the piezoelectric pillar 11. In a similar manner, the pitch and area of one dot of the piezoelectric array 10 mean an average from an upper end to a lower end of the piezoelectric array 10.

Figure 11:
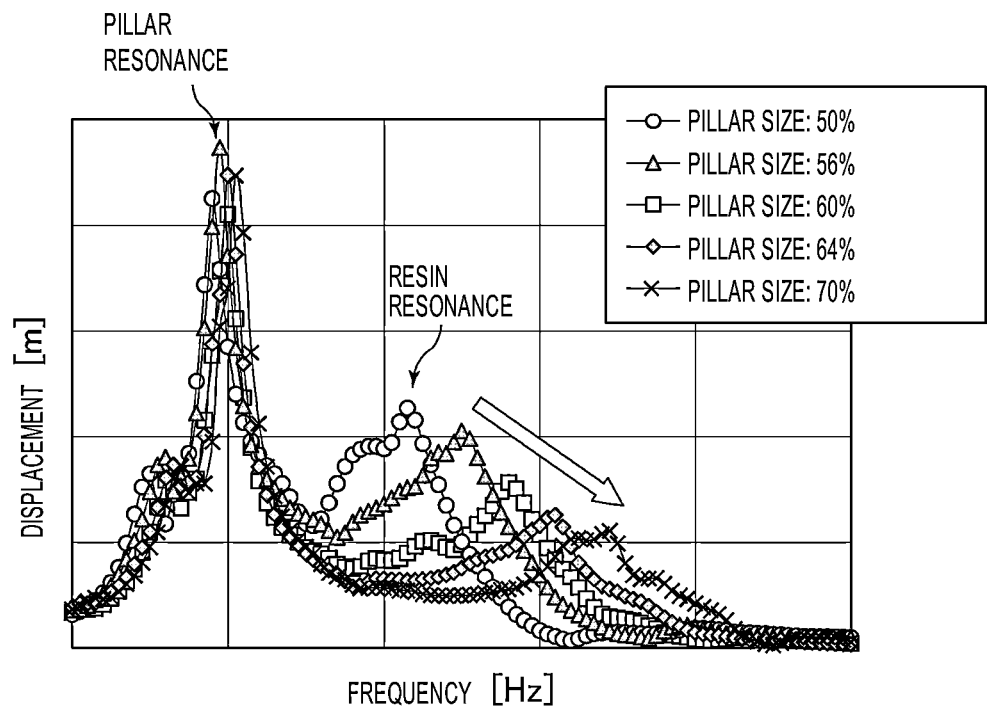
FIG. 11 is a graph showing an FEM analysis result obtained by changing a size of a piezoelectric pillar.

FIG. 11 is a graph showing an FEM analysis result obtained by changing a size of a piezoelectric pillar. A displacement monitored portion is the resin portion. Specifically, displacement of a portion in which an electrode is covered by the resin portion is monitored.

In FIG. 11, the peak in low frequency waves (left side) represents resonance of the piezoelectric pillars and the peak in high frequency waves (right side) represents resonance of the resin portion. FIG. 11 shows that the resonance of the resin portion shifts to a high frequency and peak displacement is decreased when the size of the piezoelectric pillar is increased.

In Example 1, the size of one piezoelectric pillar is not particularly limited as long as the size is about 70% or greater with respect to the pitch of the piezoelectric array. However, when the resin portion is reduced in size, the interval between the piezoelectric pillars is reduced, which hardens the entire piezoelectric device and reduces displacement of the piezoelectric pillars.

Figure 12:
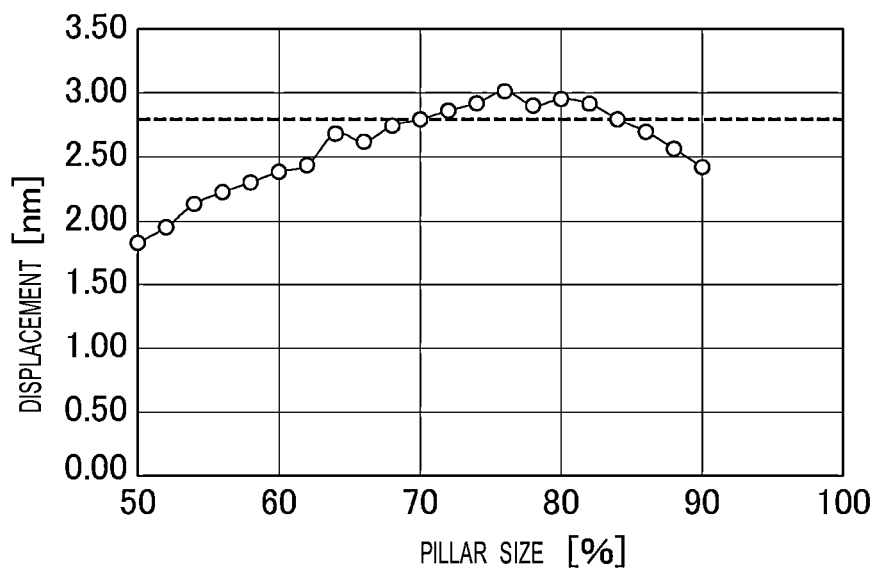
FIG. 12 is a graph showing an FEM analysis result based on a size of a piezoelectric pillar and displacement of the piezoelectric pillar.

FIG. 12 is a graph showing an FEM analysis result based on a size of a piezoelectric pillar and displacement of the piezoelectric pillar.

In FIG. 12, there is no influence of resonance of the resin portion when the size of the piezoelectric pillar is about 70% or greater. On the other hand, when the size of the piezoelectric pillar exceeds about 84%, the resin portion, which is soft, is reduced in size, which decreases displacement.

From the result of FIG. 12, the size of one piezoelectric pillar is preferably, for example, about 84% or smaller with respect to the pitch of the piezoelectric array. In a similar manner, the area of one piezoelectric pillar is preferably, for example, about 71% or smaller with respect to the area of one dot of the piezoelectric array.

The piezoelectric device according to Example 1 may have at least one of the following structures.

The thickness of the resin portion is smaller than the height of the piezoelectric pillar.

In at least one of the first electrode and the second electrode, the width of an electrode wire covering the resin portion is smaller than the width of an electrode wire covering the piezoelectric pillar.

In at least one of the first electrode and the second electrode, the thickness of an electrode wire covering the resin portion is smaller than the thickness of an electrode wire covering the piezoelectric pillar.

In at least one of the first electrode and the second electrode, the covering ratio of an electrode wire shifted over the resin portion is about 30% or smaller.

In at least one of the first end portion and second end portion of the piezoelectric pillar, the length of a concave around the piezoelectric pillar is about 50% or smaller with respect to the length of a circumference of the piezoelectric pillar.

EXAMPLE 2

In a piezoelectric device according to Example 2 of a preferred embodiment of the present invention, a resonant frequency of a resin portion is higher than a resonant frequency of a piezoelectric pillar by about 15% or greater and a thickness of the resin portion is smaller than a height of the piezoelectric pillar.

Figure 13:
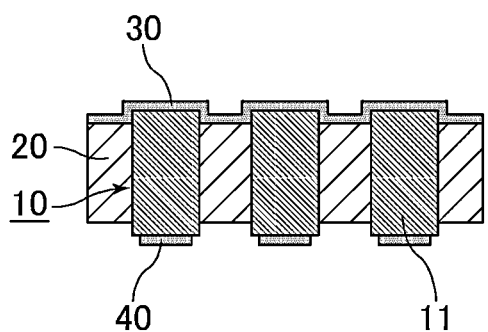
FIG. 13 is a sectional view schematically illustrating an example of a piezoelectric device according to Example 2 of a preferred embodiment of the present invention.

FIG. 13 is a sectional view schematically illustrating a typical example of a piezoelectric device according to Example 2.

In FIG. 13, the thickness of the resin portion 20 is smaller than the height of the piezoelectric pillar 11, being smaller with respect to upper and lower surfaces of the piezoelectric pillar 11. As long as the thickness of the resin portion 20 is smaller than the height of the piezoelectric pillar 11, the resin portion 20 may be smaller in thickness with respect to only the upper surface or only to the lower surface of the piezoelectric pillar 11.

A piezoelectric device is processed into a desired thickness by grinding or polishing, for example. Here, ceramic is easily ground because of its hardness, while resin is hard to be ground because of its softness. Further, during grinding while applying pressure with a grindstone or the like, resin easily contracts because of its softness, while ceramic does not contract because of its hardness. Accordingly, ceramic is first ground. As a result, a resin portion tends to have a larger thickness compared to the height of a piezoelectric pillar. However, when a resin portion has a larger thickness, the resonance of the resin portion is shifted to a lower frequency, which adversely affects vibration of piezoelectric pillars. Therefore, after mechanical grinding or polishing, the resin portion is burnt away by ashing with $O_2$ plasma, for example, so as to make the resin portion thinner than the piezoelectric pillars. Consequently, the resonance of the resin portion is shifted to a higher frequency, and vibration characteristics of the pillars can be thus improved.

Figure 14:
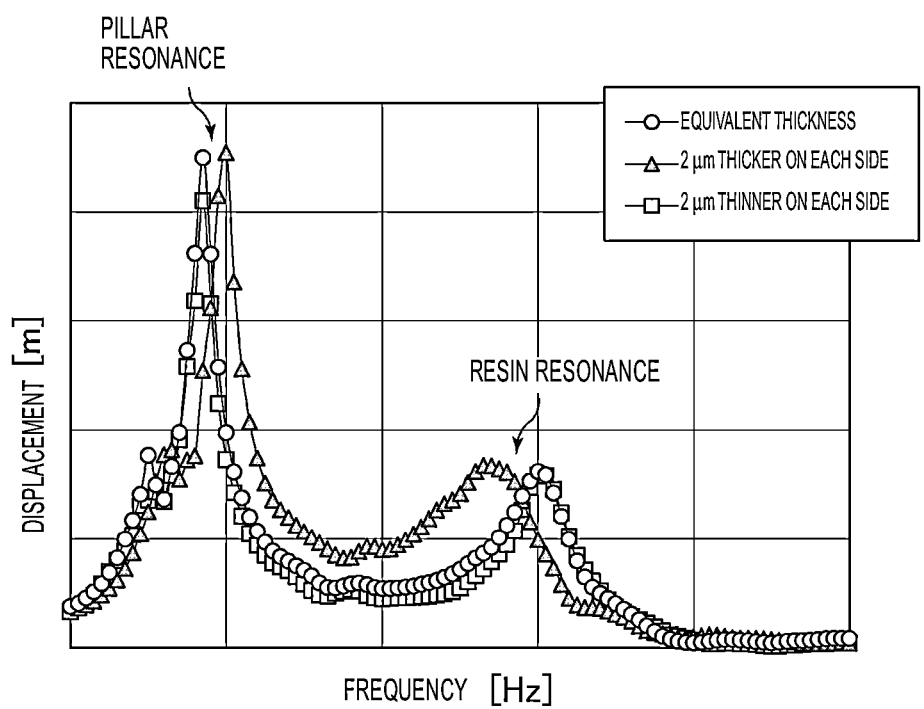
FIG. 14 is a graph showing an FEM analysis result obtained by changing a thickness of a resin portion.

FIG. 14 is a graph showing an FEM analysis result obtained by changing a thickness of a resin portion. A displacement monitored portion is the resin portion. FIG. 14 shows FEM analysis results for a resin portion whose thickness is equivalent to the height of piezoelectric pillars of about 70 μm, a resin portion which is thinned from its upper and lower surfaces respectively by about 2 μm, and a resin portion which is thickened from its upper and lower surfaces respectively by about 2 μm. FIG. 14 shows that resonance of the resin portion is close to resonance of the piezoelectric pillar when the resin portion has a larger thickness.

The piezoelectric device according to Example 2 may have at least one of the following structures.
  In plan view in the thickness direction of the piezoelectric array, the area of one piezoelectric pillar is about 49% or greater with respect to the area of one dot of the piezoelectric array.
  In plan view in the thickness direction, the size of one piezoelectric pillar is about 70% or greater with respect to the pitch of the piezoelectric array.
  In at least one of the first electrode and the second electrode, the width of an electrode wire covering the resin portion is smaller than the width of an electrode wire covering the piezoelectric pillar.
  In at least one of the first electrode and the second electrode, the thickness of an electrode wire covering the resin portion is smaller than the thickness of an electrode wire covering the piezoelectric pillar.
  In at least one of the first electrode and the second electrode, the covering ratio of an electrode wire shifted over the resin portion is about 30% or smaller.
  In at least one of the first end portion and second end portion of the piezoelectric pillar, the length of a concave around the piezoelectric pillar is about 50% or smaller with respect to the length of a circumference of the piezoelectric pillar.

EXAMPLE 3

In a piezoelectric device according to Example 3 of a preferred embodiment of the present invention, a resonant frequency of a resin portion is higher than a resonant frequency of a piezoelectric pillar by about 15% or greater, and a width of an electrode wire covering the resin portion is smaller than a width of an electrode wire covering the piezoelectric pillar in at least one of a first electrode and a second electrode.

In the piezoelectric device according to Example 3, the width of the electrode wire covering the resin portion may be smaller than the width of the electrode wire covering the piezoelectric pillar in either one of the first electrode and the second electrode, or the width of the electrode wire covering the resin portion may be smaller than the width of the electrode wire covering the piezoelectric pillar in both of the first electrode and the second electrode.

Figure 15A:
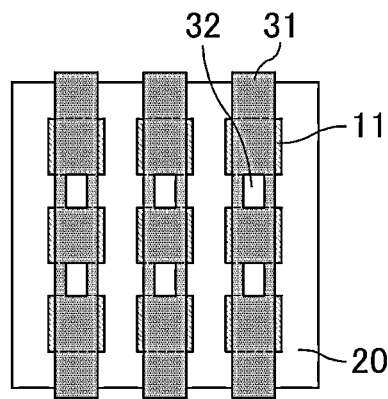
FIGS. 15A to 15C are plan views schematically illustrating an example of a piezoelectric device according to Example 3 of a preferred embodiment of the present invention.
Figure 15B:
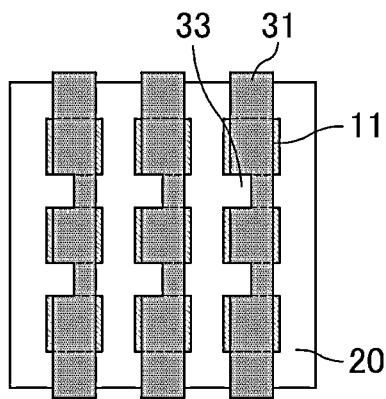
Figure 15C:
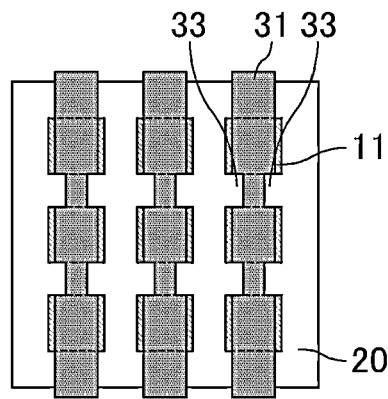
Figure 15D:
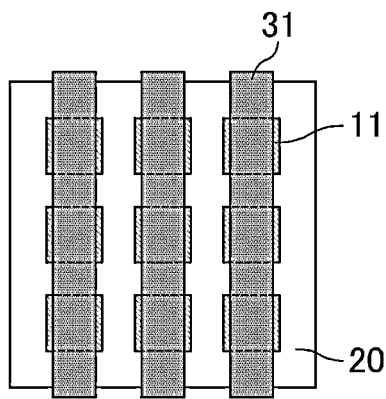
FIG. 15D is a plan view schematically illustrating a piezoelectric device in which a width of an electrode wire covering a resin portion is equal to a width of an electrode wire covering the piezoelectric pillar.

FIGS. 15A to 15C are plan views schematically illustrating an example of a piezoelectric device according to Example 3. FIG. 15D is a plan view schematically illustrating a piezoelectric device in which a width of an electrode wire covering a resin portion is equal or substantially equal to a width of an electrode wire covering the piezoelectric pillar.

In FIG. 15A, the first electrode wire 31 covering the resin portion 20 includes openings 32 penetrating in the thickness direction of the piezoelectric array. In FIG. 15B, the first electrode wire 31 covering the resin portion 20 includes cutouts 33 on one side thereof. In FIG. 15C, the first electrode wire 31 covering the resin portion 20 includes cutouts 33 on two sides thereof.

Figure 16:
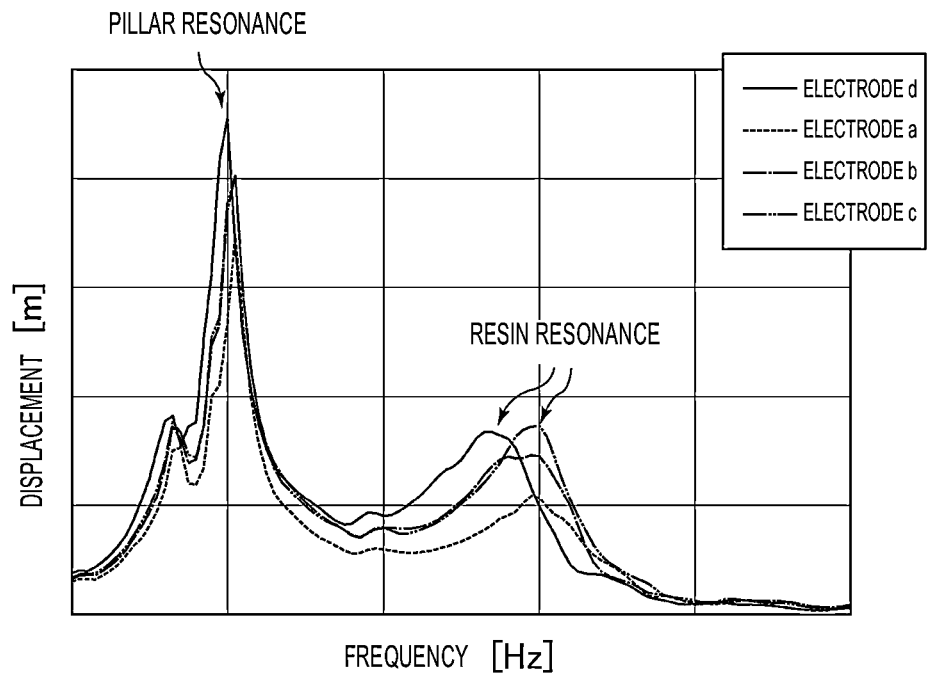
FIG. 16 is a graph showing an FEM analysis result obtained by changing a width of an electrode covering a resin portion.

FIG. 16 is a graph showing an FEM analysis result obtained by changing a width of an electrode covering a resin portion. A displacement monitored portion is the resin portion. Planar shapes of an electrode a, electrode b, electrode c, and electrode d respectively correspond to FIGS. 15A to 15D. Further, compared to the electrode d, the sum of the widths of electrode wires covering the resin portion is about ⅔ of the widths of electrode wires covering the piezoelectric pillars in terms of the electrode a, electrode b, and electrode c. FIG. 16 shows that resonance of the resin portion is shifted to a higher frequency when using the electrode a, electrode b, and electrode c, compared to the electrode d. It is also shown that displacement of the resonance of the resin portion is decreased if the electrode wires covering the resin portion have openings as the electrode a.

Figure 17:
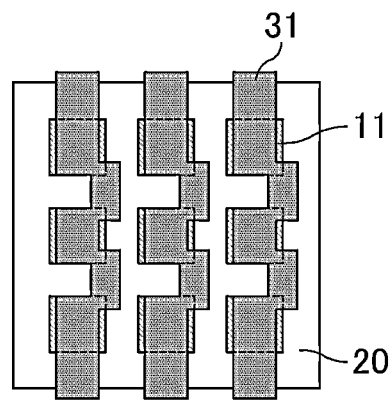
FIG. 17 is a plan view schematically illustrating a modification of the piezoelectric device of Example 3.

FIG. 17 is a plan view schematically illustrating a modification of the piezoelectric device of Example 3.

As illustrated in FIG. 17, the first electrode wires 31 covering the resin portion 20 may be patterned such that the first electrode wires 31 are shifted sideways.

The piezoelectric device according to Example 3 may have at least one of the following structures.
  In plan view in the thickness direction of the piezoelectric array, the area of one piezoelectric pillar is about 49% or greater with respect to the area of one dot of the piezoelectric array.
  In plan view in the thickness direction, the size of one piezoelectric pillar is about 70% or greater with respect to the pitch of the piezoelectric array.
  The thickness of the resin portion is smaller than the height of the piezoelectric pillar.
  In at least one of the first electrode and the second electrode, the thickness of an electrode wire covering the resin portion is smaller than the thickness of an electrode wire covering the piezoelectric pillar.
  In at least one of the first electrode and the second electrode, the covering ratio of an electrode wire shifted over the resin portion is about 30% or smaller.
  In at least one of the first end portion and second end portion of the piezoelectric pillar, the length of a concave around the piezoelectric pillar is about 50% or smaller with respect to the length of a circumference of the piezoelectric pillar.

EXAMPLE 4

In a piezoelectric device according to Example 4 of a preferred embodiment of the present invention, a resonant frequency of a resin portion is higher than a resonant frequency of a piezoelectric pillar by about 15% or greater, and a thickness of an electrode wire covering the resin portion is smaller than a thickness of an electrode wire covering the piezoelectric pillar in at least one of a first electrode and a second electrode.

In the piezoelectric device according to Example 4, the thickness of the electrode wire covering the resin portion may be smaller than the thickness of the electrode wire covering the piezoelectric pillar in either one of the first electrode and the second electrode, or the thickness of the electrode wire covering the resin portion may be smaller than the thickness of the electrode wire covering the piezoelectric pillar in both of the first electrode and the second electrode.

Figure 18:
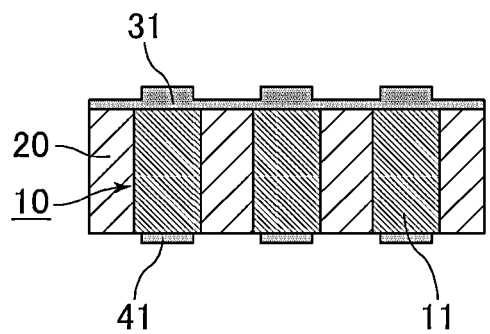
FIG. 18 is a sectional view schematically illustrating an example of a piezoelectric device according to Example 4 of a preferred embodiment of the present invention.

FIG. 18 is a sectional view schematically illustrating an example of a piezoelectric device according to Example 4.

In FIG. 18, the thickness of the first electrode wire 31 covering the resin portion 20 is smaller than the thickness of the first electrode wire 31 covering the piezoelectric pillar 11.

Also in the piezoelectric device according to Example 4, the resonant frequency of the resin portion can be raised as is the case with the piezoelectric device of Example 3.

The piezoelectric device according to Example 4 may have at least one of the following structures.

- In plan view in the thickness direction of the piezoelectric array, the area of one piezoelectric pillar is about 49% or greater with respect to the area of one dot of the piezoelectric array.
- In plan view in the thickness direction, the size of one piezoelectric pillar is about 70% or greater with respect to the pitch of the piezoelectric array.
- The thickness of the resin portion is smaller than the height of the piezoelectric pillar.
- In at least one of the first electrode and the second electrode, the width of an electrode wire covering the resin portion is smaller than the width of an electrode wire covering the piezoelectric pillar.
- In at least one of the first electrode and the second electrode, the covering ratio of an electrode wire shifted over the resin portion is about 30% or smaller.
- In at least one of the first end portion and second end portion of the piezoelectric pillar, the length of a concave around the piezoelectric pillar is about 50% or smaller with respect to the length of a circumference of the piezoelectric pillar.

EXAMPLE 5

In a piezoelectric device according to Example 5 of a preferred embodiment of the present invention, a resonant frequency of a resin portion is higher than a resonant frequency of a piezoelectric pillar by about 15% or greater, and a covering ratio of an electrode wire shifted over the resin portion is about 30% or smaller in at least one of a first electrode and a second electrode. The covering ratio of the electrode wire shifted over the resin portion may be about 0%.

In the piezoelectric device according to Example 5, the covering ratio of the electrode wire shifted over the resin portion may be about 30% or smaller in either one of the first electrode and the second electrode, or the covering ratio of the electrode wire shifted over the resin portion may be about 30% or smaller in both of the first electrode and the second electrode.

Figure 19:
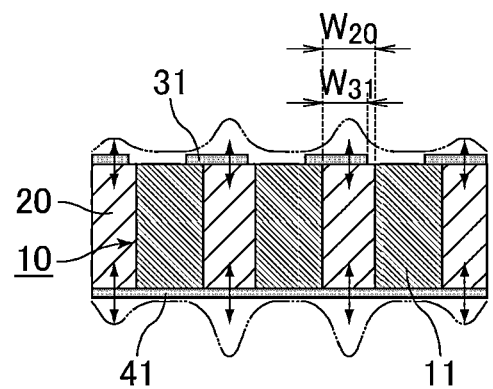
FIG. 19 is a sectional view schematically illustrating an example of a piezoelectric device according to Example 5 of a preferred embodiment of the present invention.

FIG. 19 is a sectional view schematically illustrating an example of a piezoelectric device according to Example 5.

In FIG. 19, the first electrode wire 31 is shifted over the resin portion 20 and a portion of the first electrode wire 31 covers the resin portion 20. The covering ratio of the first electrode wire 31 shifted over the resin portion 20 means the ratio of a width $W_{31}$ of the first electrode wire 31 covering the resin portion 20 to a width $W_{20}$ of the resin portion 20. Similarly, the covering ratio of the second electrode wire 41 shifted over the resin portion 20 also means the ratio of a width $W_{41}$ (not illustrated) of the second electrode wire 41 covering the resin portion 20 to the width $W_{20}$ of the resin portion 20.

As described with reference to FIG. 5D, when the upper and lower surfaces of the resin portion 20 are covered by the first electrode wires 31 and the second electrode wires 41, the resonant frequency of the resin portion 20 is lowered and an amplitude is increased.

Figure 20:
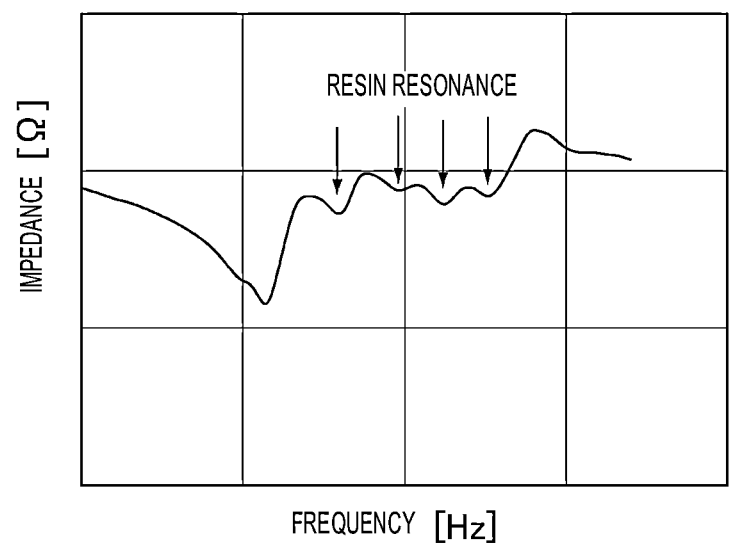
FIG. 20 is a graph showing an actual measurement value of an impedance waveform obtained when a covering ratio of an electrode wire shifted over a resin portion is about 75%.

FIG. 20 is a graph showing an actual measurement value of an impedance waveform obtained when a covering ratio of an electrode wire shifted over a resin portion is about 75%.

FIG. 20 shows that resonance of the resin portion occurs many times when the covering ratio of the electrode wire shifted over the resin portion is about 75%.

Figure 21:
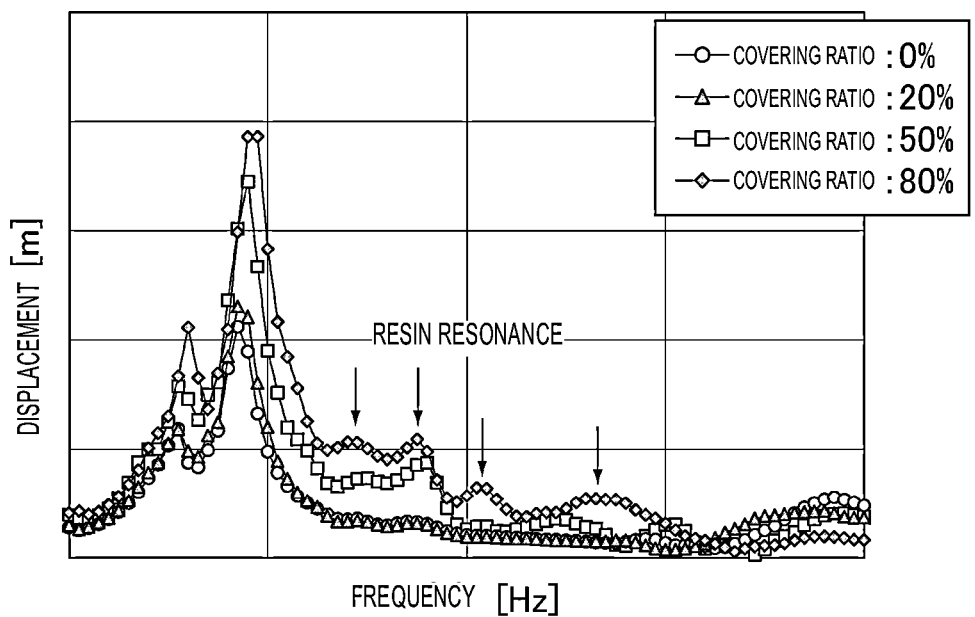
FIG. 21 is a graph showing an FEM analysis result obtained by changing a covering ratio of an electrode wire shifted over a resin portion.
Figure 22:
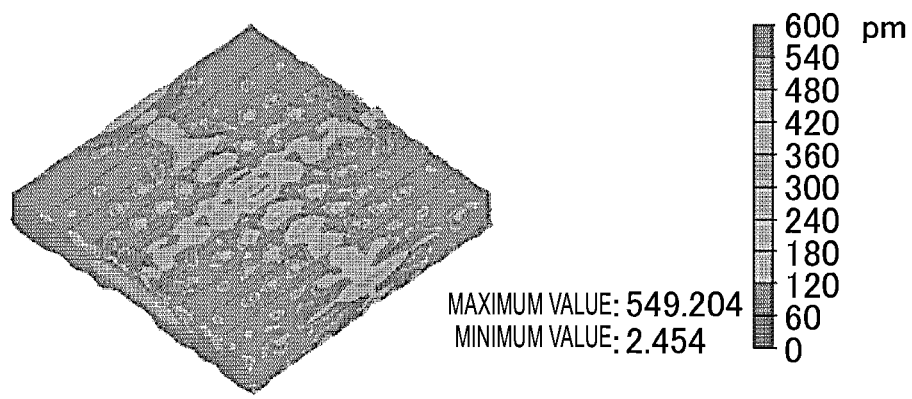
FIG. 22 is a displacement diagram of a resin portion in resonance when a covering ratio of an electrode wire shifted over the resin portion is about 80%.

FIG. 21 is a graph showing an FEM analysis result obtained by changing a covering ratio of an electrode wire shifted over a resin portion. A displacement monitored portion is the resin portion. FIG. 22 is a displacement diagram of a resin portion in resonance when a covering ratio of an electrode wire shifted over the resin portion is about 80%.

FIGS. 21 and 22 show that resonance of the resin portion occurs many times when the covering ratio of the electrode wire shifted over the resin portion exceeds about 50%.

Figure 23:
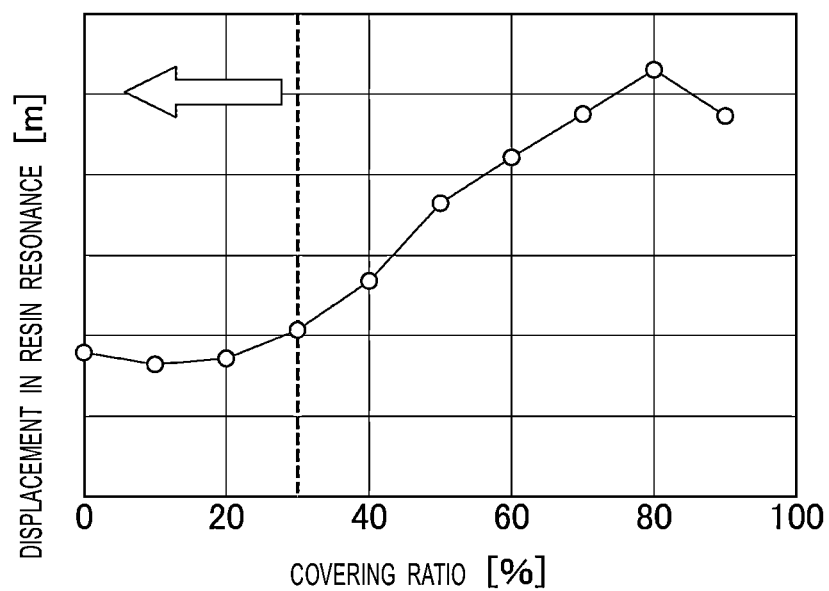
FIG. 23 is a graph showing a relationship between a covering ratio of an electrode wire shifted over a resin portion and displacement of resonance of the resin portion.

FIG. 23 is a graph showing a relationship between a covering ratio of an electrode wire shifted over a resin portion and displacement of resonance of the resin portion.

FIGS. 21 and 23 show that an occurrence of resonance of the resin portion is reduced or prevented when the covering ratio of the electrode wire shifted over the resin portion is set to about 30% or lower.

The piezoelectric device according to Example 5 may have at least one of the following structures.

- In plan view in the thickness direction of the piezoelectric array, the area of one piezoelectric pillar is about 49% or greater with respect to the area of one dot of the piezoelectric array.
- In plan view in the thickness direction, the size of one piezoelectric pillar is about 70% or greater with respect to the pitch of the piezoelectric array.
- The thickness of the resin portion is smaller than the height of the piezoelectric pillar.
- In at least one of the first electrode and the second electrode, the width of an electrode wire covering the resin portion is smaller than the width of an electrode wire covering the piezoelectric pillar.
- In at least one of the first electrode and the second electrode, the thickness of an electrode wire covering the resin portion is smaller than the thickness of an electrode wire covering the piezoelectric pillar.
- In at least one of the first end portion and second end portion of the piezoelectric pillar, the length of a concave around a piezoelectric pillar is about 50% or smaller with respect to the length of the circumference of the piezoelectric pillar.

EXAMPLE 6

In a piezoelectric device according to Example 6, a resonant frequency of a resin portion is higher than a resonant frequency of a piezoelectric pillar by about 15% or greater, and the length of a concave portion around the piezoelectric pillar is about 50% or smaller with respect to the length of the circumference of the piezoelectric pillar in at least one of the first end portion and second end portion of the piezoelectric pillar. The length of a concave around a piezoelectric pillar may be about 0% with respect to the length of the circumference of the piezoelectric pillar.

In the piezoelectric device according to Example 6, the length of the concave portion around the piezoelectric pillar may be about 50% or smaller with respect to the length of the circumference of the piezoelectric pillar in either one of the first end portion and second end portion of the piezoelectric pillar, or the length of the concave around the piezoelectric pillar may be about 50% or smaller with respect to the length of the circumference of the piezoelectric pillar in both of the first end portion and second end portion of the piezoelectric pillar.

Patterns of the first electrode and second electrode are most commonly formed by, for example, vapor deposition lift-off by lithography. In order to form fine electrodes, surface roughness of a piezoelectric array and resin portion of the 1-3 composite needs to be finer. However, if grinding is performed with a fine grit size, shedding of ceramic occurs around an interface between resin and the ceramic and a concave portion having the depth of approximately several µm is formed around a piezoelectric pillar. The reason for this is as follows: grinding cannot be efficiently performed with the fine grit size, grinding accordingly has to be performed while applying pressure, and the pressure causes shedding of ceramic in a periphery. Here, shedding means removal of ceramic grains (grain diameter: several µm) of the piezoelectric pillar.

Figure 24A:
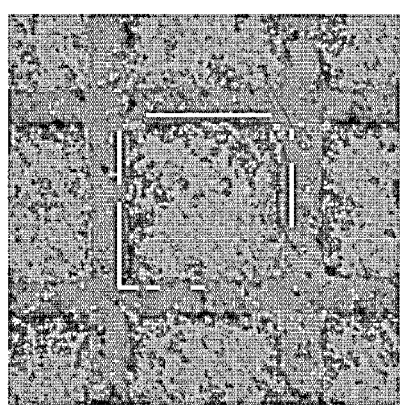
FIG. 24A is a picture obtained when grinding was performed with a fine grit size.
Figure 24B:
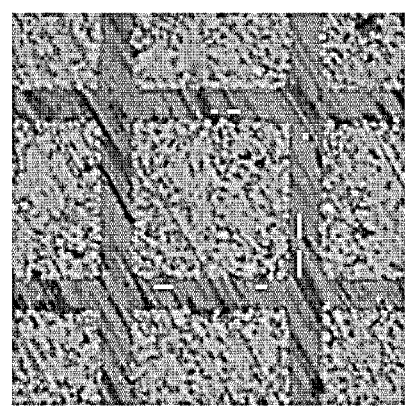
FIG. 24B is a picture obtained when grinding was performed with a rough grit size.

FIG. 24A is a picture obtained when grinding was performed with a fine grit size. Although surfaces of ceramic and resin are in a favorable state with few scratches, shedding of ceramic on a periphery occurs at positions shown by while lines. On the other hand, FIG. 24B is a picture obtained when grinding was performed with a rough grit size. Although scratches caused by grinding are noticeable, almost no shedding of ceramic on a periphery occurs as shown by white lines.

When a periphery of piezoelectric pillars is concaved by the above-described ceramic shedding, a resonant frequency of the resin portion is lowered and an amplitude is increased, causing inhibition of resonance of the piezoelectric pillars.

Figure 25A:
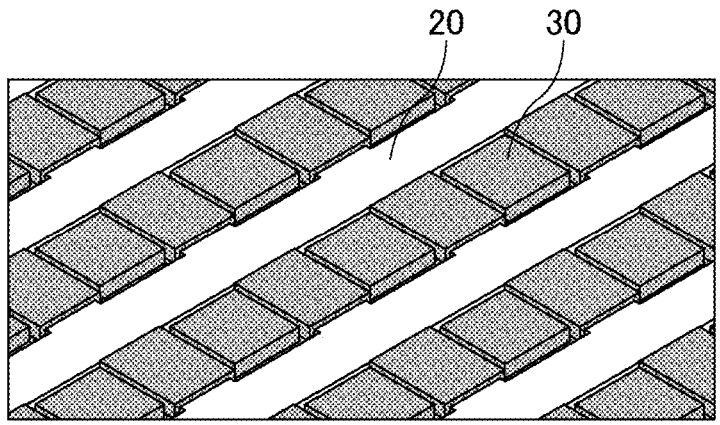
FIG. 25A is a perspective view illustrating a model in which a periphery of piezoelectric pillars is concaved by about 2 μm.
Figure 25B:
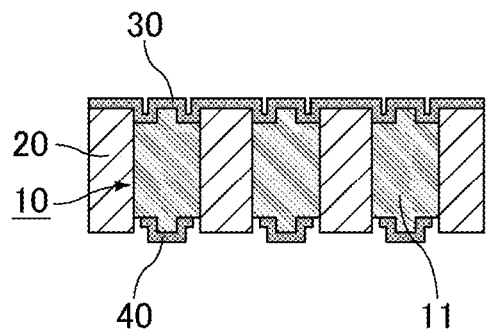
FIG. 25B is a sectional view of the model illustrated in FIG. 25A.

FIG. 25A is a perspective view illustrating a model in which a periphery of piezoelectric pillars is concaved by about 2 µm. FIG. 25B is a sectional view of the model illustrated in FIG. 25A.

Figure 26:
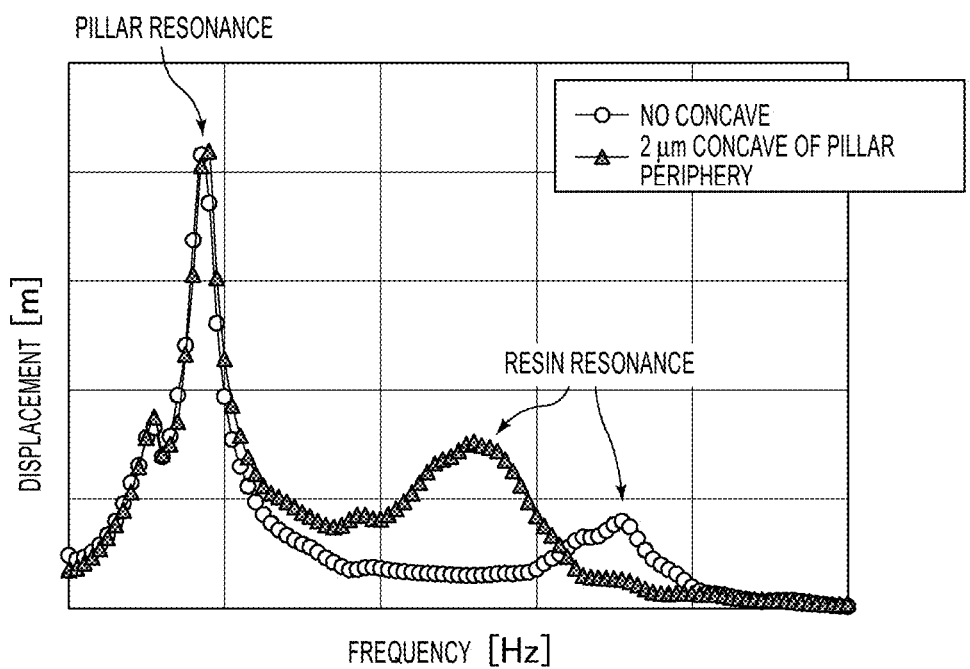
FIG. 26 is a graph showing an FEM analysis result of the model illustrated in FIGS. 25A and 25B. A displacement monitored portion is a resin portion.

FIG. 26 is a graph showing an FEM analysis result of the model illustrated in FIGS. 25A and 25B. A displacement monitored portion is a resin portion.

FIG. 26 shows that a resonant frequency of the resin portion is lowered and an amplitude is increased in the model in which a periphery of piezoelectric pillars is concaved by about 2 µm, with respect to a model in which a periphery of piezoelectric pillars is not concaved.

The piezoelectric device according to Example 6 may have at least one of the following structures.

In plan view in the thickness direction of the piezoelectric array, the area of one piezoelectric pillar is about 49% or greater with respect to the area of one dot of the piezoelectric array.

In plan view in the thickness direction, the size of one piezoelectric pillar is about 70% or greater with respect to the pitch of the piezoelectric array.

The thickness of the resin portion is smaller than the height of the piezoelectric pillar.

In at least one of the first electrode and the second electrode, the width of an electrode wire covering the resin portion is smaller than the width of an electrode wire covering the piezoelectric pillar.

In at least one of the first electrode and the second electrode, the thickness of an electrode wire covering the resin portion is smaller than the thickness of an electrode wire covering the piezoelectric pillar.

In at least one of the first electrode and the second electrode, the covering ratio of an electrode wire shifted over the resin portion is about 30% or smaller.

The piezoelectric devices according to preferred embodiments of the present invention are not limited to the above-described examples and various applications and alterations may be made in terms of the structure and manufacturing conditions of the piezoelectric device within the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
   a piezoelectric array including a plurality of piezoelectric pillars, the piezoelectric pillars having a columnar shape and being made of piezoelectric ceramic, and in which the plurality of piezoelectric pillars are provided along a row direction and a column direction in a two-dimensional array, such that the piezoelectric pillars are parallel or substantially parallel to each other in a height direction thereof;
   a resin portion located in a gap between the plurality of piezoelectric pillars;
   a first electrode including a plurality of first electrode wires extending in the column direction, the plurality of first electrode wires being provided along the column direction of the piezoelectric array and being connected to first end portions of the piezoelectric pillars; and
   a second electrode including a plurality of second electrode wires extending in the row direction, the plurality of second electrode wires being provided along the row direction of the piezoelectric array and being connected to second end portions of the piezoelectric pillars; wherein
   both of the plurality of piezoelectric pillars and the resin portion resonantly vibrate in a thickness longitudinal vibration mode; and
   a resonant frequency of the resin portion is higher than a resonant frequency of the piezoelectric pillars by about 15% or greater.

2. The piezoelectric device according to claim 1, wherein an area of one piezoelectric pillar among the plurality of piezoelectric pillars is about 49% or greater than an area of one dot of the piezoelectric array in plan view in a thickness direction of the piezoelectric array.

3. The piezoelectric device according to claim 2, wherein the area of the one piezoelectric pillar among the plurality of piezoelectric pillars is about 71% or smaller than the area of one dot of the piezoelectric array in the plan view in the thickness direction of the piezoelectric array.

4. The piezoelectric device according to claim 1, wherein a size of one piezoelectric pillar among the plurality of piezoelectric pillars is about 70% or greater than a pitch of the piezoelectric array in plan view in a thickness direction of the piezoelectric array.

5. The piezoelectric device according to claim 4, wherein the size of the one piezoelectric pillar among the plurality of piezoelectric pillars is about 84% or smaller than the pitch of the piezoelectric array in the plan view in the thickness direction of the piezoelectric array.

6. The piezoelectric device according to claim 1, wherein a thickness of the resin portion is smaller than a height of the plurality of piezoelectric pillars.

7. The piezoelectric device according to claim 1, wherein a width of an electrode wire covering the resin portion is smaller than a width of an electrode wire covering the piezoelectric pillars in at least one of the first electrode and the second electrode.

8. The piezoelectric device according to claim 7, wherein the electrode wire covering the resin portion includes an opening penetrating in a thickness direction of the piezoelectric array.

9. The piezoelectric device according to claim 7, wherein a thickness of the electrode wire covering the resin portion is smaller than a thickness of the electrode wire covering the piezoelectric pillars in at least one of the first electrode and the second electrode.

10. The piezoelectric device according to claim 1, wherein each of the plurality of piezoelectric pillars are polarized in the height direction.

11. The piezoelectric device according to claim 1, wherein the piezoelectric ceramic has a higher piezoelectric constant in the height direction than in a width direction.

12. The piezoelectric device according to claim 1, wherein the plurality of piezoelectric pillars are spaced apart from one another at a pitch of about 50.8 µm.

13. The piezoelectric device according to claim 12, wherein the pitch is the same or substantially the same in the row direction and in the column direction.

14. The piezoelectric device according to claim 1, wherein the plurality of piezoelectric pillars include 120 piezoelectric pillars in the row direction and 120 piezoelectric pillars in the column direction.

15. The piezoelectric device according to claim 1, wherein each of the plurality of piezoelectric pillars has a square or substantially square planar shape when viewed in the height direction.

16. The piezoelectric device according to claim 1, wherein a height of each of the plurality of piezoelectric pillars is about 70 µm.

17. The piezoelectric device according to claim 1, wherein the first electrode is a drive electrode.

18. The piezoelectric device according to claim 1, wherein the second electrode is a reception electrode.

* * * * *